US 6,541,709 B1

(12) United States Patent
Franklin et al.

(10) Patent No.: US 6,541,709 B1
(45) Date of Patent: *Apr. 1, 2003

(54) INHERENTLY ROBUST REPAIR PROCESS FOR THIN FILM CIRCUITRY USING UV LASER

(75) Inventors: Peter A. Franklin, Marlboro, NY (US); Arthur G. Merryman, Hopewell Junction, NY (US); Rajesh S. Patel, Fremont, CA (US); Thomas A. Wassick, Lagrangeville, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1056 days.

(21) Appl. No.: 08/743,405

(22) Filed: Nov. 1, 1996

(51) Int. Cl.⁷ ................................. H05K 1/03
(52) U.S. Cl. .................. 174/255; 174/250; 174/261; 361/777
(58) Field of Search .................. 174/250, 254, 174/255, 256, 261; 361/728, 767, 777, 807; 257/209, 529, 786; 438/131, 132, 601

(56) References Cited

U.S. PATENT DOCUMENTS

| 4,254,445 A | 3/1981 | Ho | 361/728 |
| 4,480,288 A | 10/1984 | Gazdik et al. | 361/751 |
| 4,489,364 A | 12/1984 | Chance et al. | 361/737 |
| 5,220,490 A | 6/1993 | Weigler et al. | 361/777 |
| 5,224,022 A | 6/1993 | Weigler et al. | 361/777 |
| 5,243,140 A | 9/1993 | Bhatia et al. | 174/254 |
| 5,258,236 A | 11/1993 | Arjavalingam et al. | 428/626 |
| 5,371,390 A | * 12/1994 | Mohsen | 257/209 |

OTHER PUBLICATIONS

IBM Technical Disclosure Bulletin, vol. 20, No. 9, Feb. 1978, pp. 3729–3730. *Planar Wiring Repair Technique for the Thin–Film Metal Package Via Solder Evaporation.*

* cited by examiner

Primary Examiner—Albert W. Paladini
(74) Attorney, Agent, or Firm—DeLio & Peterson LLC; John J. Tomaszewski; Margaret A. Pepper

(57) ABSTRACT

A multilayer thin film structure having defined strap repair lines thereon and a method for repairing interconnections in the multilayer thin film structure (MLTF) and/or making engineering changes (EC) are provided. The method determines interconnection defects in the MLTF at a thin film layer adjacent the top metal layer of the structure, defines the top surface metallization including a series of orthogonal X conductor lines and Y conductor lines using photoresist and lithography and additive or subtractive metallization techniques and then uses a phototool to selectively expose the photoresist to define top surface strap connections needed to repair the interconnections and/or make EC's, and forms the top surface metallization.

5 Claims, 3 Drawing Sheets

INHERENTLY ROBUST REPAIR PROCESS FOR THIN FILM CIRCUITRY USING UV LASER

BACKGROUND OF THE INVENTION

1. Field of the Invention

This invention relates to multilayer thin film (MLTF) structure containing electronic packages such as multi-chip modules (MCM) and, more particularly, to a method for making engineering changes (EC's) in the electronic structure and/or repairing defective electrical connections in the MLTF structure and to the resulting MLTF structure and electronic component fabricated by the repair method.

2. Description of Related Art

Thin film electronic components offer an attractive packaging solution for high performance and light weight systems such as in computer, telecommunication, military and consumer applications. With the Semiconductor Industry Association (SIA) predicting clock frequencies in the range 200 MHz–1 GHz in the year 2000, the use for thin film packaging will continue to increase. Though thin films offer high density interconnections, the manufacturing process typically produces some number of non-working interconnections due to process induced defects and a resulting low component product output yield. To assure the quality and reliability of the product, the defective interconnections need to be repaired to ensure their functionality, so as to assure a fault free electronic package.

Package interconnections consist of multiple layers of interconnections which are used to interconnect various parts of the system. After all the layers of the MLTF are fabricated, a final test is performed from the top surface of the package to separate defective interconnects from defect-free interconnects to guarantee the functionality of the interconnects and the package. Since a fully functioning package cannot support any defective interconnects, the package must either be thrown away, which is not feasible for thin film packages due to the high cost involved, or the defective interconnects can be repaired. The repair option accordingly represents an attractive solution for thin film packages.

In the past, repair schemes such as Direct Distribution Engineering Change (DDEC) as shown in U.S. Pat. No. 5,243,140 has been used whereby a series of 'add' and 'delete' repair operations have been used on a fixed metal layout on the top surface of the MLTF structure. In general, the repair scheme utilizes two correction pads arranged in an array, at least two direct distribution structures, a signal pad and conductor extending between at least two direct distribution structures.

In U.S. Pat. No. 4,254,445 a module for LSI chips includes an orthogonal array of sets of pads and fan-out metallization for a large number of chips. Running parallel to the sides of the chips and the fan-out area are several parallel prefabricated, thin film engineering change (EC) interconnection lines terminating in pads adjacent to the fan-out. The pads are arranged to permit discretionary connections of the fan-outs to the EC pads with minimal crossovers by means of short fly wires.

U.S. Pat. No. 4,489,364 shows a chip carrying module including a number of EC change lines buried below the surface of the module. The EC lines are interrupted periodically to provide a set of vias extending up to the upper surface of the module between each set of chips where the vias are connected by dumbbell-shaped pads including a narrow link which permits laser deletion. The fan-out pads can be connected to the pads by means of fly-wires.

U.S. Pat. Nos. 5,220,490 and 5,224,022 show custom interconnections done by personalizing (not repairing) the top metal wiring. The customizable circuit has a high density of orthogonally placed X and Y conductors capable of interconnecting closely spaced LSI circuits.

The above patents are incorporated herein by reference.

A typical thin film structure containing a number of interconnections using vias, pads and connecting conductor straps is shown in cross-section FIG. 1 as numeral 10. The structure is typically mounted on a substrate (not shown) such as a ceramic material (MCM-D/C) containing wiring. The MLTF structure consists of a power plane (brick) or capture level 19, mesh 1 level 11, X wiring layer 12, Y wiring layer 13, ground plane mesh 2 layer 14 and a top surface metallurgy level (TSM) 15. The top surface metallurgy (TSM) level contains the vias 16, corresponding pads 17 and via-pad strap connectors 18 for connecting chips to the thin film package. The top surface metallurgy level would also contain the repair wires for correcting faulty interconnections or making EC's as discussed hereinbelow.

FIG. 2, which represents a partial top view of a typical MCM and of the TSM metallization level 15 of FIG. 1 shows one chip area bounded by the dotted lines 27, vias 16 and chip connection pads 17 (such as controlled collapse chip connection pads known as C4 pads) with the vias representing connections to the I/O in the MLTF structure and supporting substrate if any and the C4 pads represent the microsockets supporting the C4 balls connecting the chip to the thin film substrate. As can be seen from the figure, the C4 pads 17 are offset from the vias 16, which is preferable in high performance machines to ensure the elimination of any discontinuities which may arise due to the presence of the faulty interconnection still connected to the repaired wire. In the figure, the C4 pads are connected to the vias by conductor straps 18 that provide the connection for non-faulty interconnections. The strap is conventionally created by a mask during the fabrication of the TSM and if the interconnection is faulty, a laser delete operation is necessary to disconnect the faulty interconnection from the C4 pad. As will be more fully discussed hereinbelow, vias 16a and 16b were found to be part of defective interconnections and are not to be used. Corresponding pads 17a and 17b are shown connected to repair lines 30R and 30R' by straps 18R and 18R', respectively.

Bearing in mind the problems and deficiencies of the prior art, it is therefore an object of the present invention to provide a method for repairing interconnections and/or making engineering changes in multilayer thin film containing electronic components such as MCM's.

Another object of the invention is to provide a method for repairing interconnections and/or making EC's in multilayer thin containing film electronic components employed on top of ceramic, laminate, dielectric or other substrates.

A further object of the invention is to provide a MLTF structure having repair lines and/or EC lines made using the method of the invention.

A still further object of the invention is to provide a multi-chip module containing a MLTF structure having repair lines and/or EC lines made using the method of the invention.

Still other objects and advantages of the invention will in part be obvious and will in part be apparent from the specification.

SUMMARY OF THE INVENTION

The above and other objects, which will be apparent to those skilled in the art, are achieved by the present invention which relates to a method for repairing interconnections in multilayer thin film (MLTF) structures typically used to make multi-chip modules (MCM) by employing the MLTF structure on MCM's such as MCM-C (ceramic substrate), MCM-D (non-conductive substrate) and MCL-L (laminate substrate) comprising making the MLTF layer by layer up to a layer adjacent the top surface layer, determining the interconnection defects at the thin film layer below and adjacent to the top surface layer of the MLTF structure, defining the top surface connections needed to repair the defective interconnections based on the defects uncovered and/or EC's desired, preferably using a computerized algorithm to determine the best metal line routes on the top surface layer, defining by a photoresist technique the top surface layer to form the top surface metallization and a plurality of orthogonal X-Y repair lines and then connecting pads of vias needing repair by metal connecting line straps to an X repair line and/or a Y repair line and then connecting the connected X and/or Y repair line to the desired pad by metal connecting line straps by exposing the photoresist layer based on the defects uncovered and/or EC changes desired to define the desired metal connecting lines and then developing and plating the top surface metallization layer.

Broadly stated, after the MLTF has been formed to the thin film layer adjacent to and below the TSM layer, electrical testing is performed to determine any faulty interconnections. The interconnection faults may arise due to opens or shorts in the wiring. Simple capacitance testing or other such testing methods can be used to differentiate between the defective and defect-free interconnections. It is important to note that any opens in an input/output (I/O) net or power-ground plane short is a fatal defect and cannot be repaired. Next the top surface metallurgy level is built similarly by applying a polyimide or similar dielectric material having defined vias, applying a metal conducting layer, applying a photoresist layer and using, for example, a fixed mask to define the C4 pads, via capture pads, a plurality of orthogonal X-Y conductor lines preferably positioned both within and outside the chip footprint area and running between the chip areas, and conducting straps connecting the pads to the via locations. Defective interconnections are preferably isolated so that there is no conductor strap between the pad and corresponding defective via interconnection. Using the determined interconnection data, the straps needed on the top surface to repair the component by connecting pads of defective vias to other pads are defined using a phototool to expose the metal line repair straps and then the photoresist is developed and the complete top surface metallurgy plated.

For each defect and/or engineering change made, the repair line from the "defective" pad to the repair location, is a first repair strap to an X line and/or Y line and is a single (individual) conductive line used to repair each defective via or to make each engineering change. A second repair strap is then needed to connect from the first repair strap connected X line and/or Y line to the desired pad. X repair lines and Y repair lines are then interconnected in a similar fashion by using a phototool to reform the circuit path or connect the "defective" pad to the desired repair pad. The photoresist is then developed and the complete top surface metallurgy plated.

In another aspect of the invention, the proposed method of the invention can also be used for implementing engineering changes (EC's). EC's are required in a product to make changes at the systems level. In this method, EC's can be incorporated by using some of the C4 pads primarily for ECs with an EC wire buried in the substrate and connected to the C4 pad. The repair scheme can be used to disconnect or delete the straps between the via and the C4 pad of the original connection, and exposing a strap to an X line and/or Y line for developing and metallization which repair strap would then be connected to the defined EC C4 pad as described hereinabove. EC's are described and shown in U.S. Pat. No. 5,243,140, supra.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1:
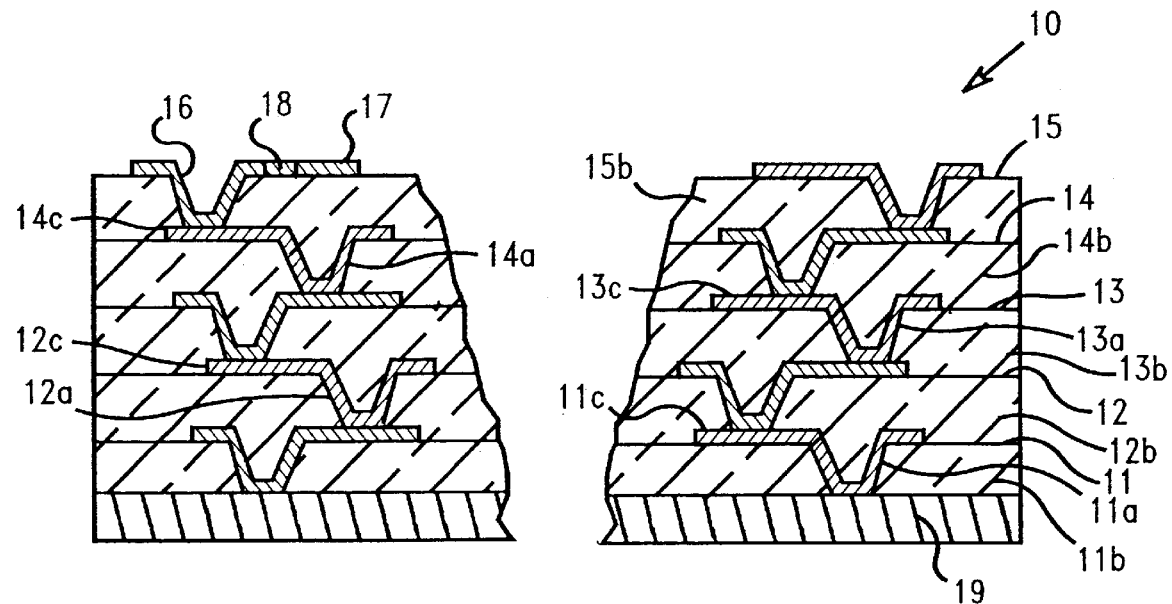
FIG. 1 is a side elevational view of a multilayer thin film structure electronic component repairable by the method of the present invention.

In describing the preferred embodiment of the present invention, reference will be made herein to FIGS. 1–10 of the drawings in which like numerals refer to like features of the invention. Features of the invention are not necessarily shown to scale in the drawings.

The repair scheme can be used for any MLTF structure having any number of layers. FIG. 1 shows the cross-section of the MLTF structure shown generally as 10 which in this case consists of 5 metal layers (11–14 and 19) and a metal TSM layer 15. The TSM layer would contain features such as the chip connection pads, vias, via-pad connector straps and repair structures. The 5 metal layers are listed below:

Layer 1: Capture Pad (19)
Layer 2: Mesh 1 (11)
Layer 3: X Wiring Level (12)
Layer 4: Y Wiring Level (13)
Layer 5: Mesh 2 (14)

Layers 11–14 comprise vias (11a, 12a, 13a and 14a) in corresponding dielectric layers 11b, 12b, 13b and 14b and metal lines on top of the dielectric and in the vias (11c, 12c, 13c and 14c). Other MLTF wiring not shown is also on each layer as is well-known in the art. The pads, straps and vias interconnect layer by layer and form the interconnections terminating on the top surface 15. The top level 15 include vias 16, pads 17, straps 18 and a plurality of orthogonal X conductor lines 30R and Y conductor lines 31R (not shown). Some of these interconnections may be defective and need to be repaired using the method of the invention.

The repair scheme used is based on the electrical testing and/or inspection for defects at the MLTF layer 14 which is the layer below and adjacent to the top surface layer 15 and the use of defined X and Y orthogonal conductor lines on the top surface. The conductor lines are connected to pads of defective vias by metal plating repair straps using the test data to control an expose device such as a phototool on the top surface 15 of the thin film (structure). The test data is used to define a repair strap from the pad of the defective via to a X conductor line and or a Y conductor line. The phototool is used with an algorithm that analyzes the test data and determines the best or most efficient repair layout needed for the TSM level. After the application of conductor layer and photoresist layers, the phototool controlled by the algorithm is moved over the top surface 15 typically in an X-Y direction, to expose the resist forming the desired repair strap connections. The phototool may also be used to define the pads, vias, etc., however, much of this is generally done using a fixed mask due to cost consideration. A phototool typically comprises an UV or electronic beam source, a shutter and condensing lens with a variable aperture and a reduction lens, and having a data system to facilitate control of the exposure area, dosage and location.

The plurality of orthogonal X and Y conductor lines are established in such a fashion to permit access of all the signal pads from the interconnected devices, and to permit access to all devices on the substrate. In order to permit X and Y conductor lines to cross without breaking their continuity one of them (typically the Y lines) are fabricated using both the top surface and the layer 14 below (Mesh 2). At every point where an X line needs to cross a Y line, the Y line travels beneath the X line on a subway feature connected to the TSM through vias of each end. A cross-section is shown schematically in FIG. 10. Thus, the Mesh layer 14 adjacent to the TSM contains subway features that permit repair line continuity and orthogonality as well as the power distribution and via interconnects required by the package function.

Figure 2:
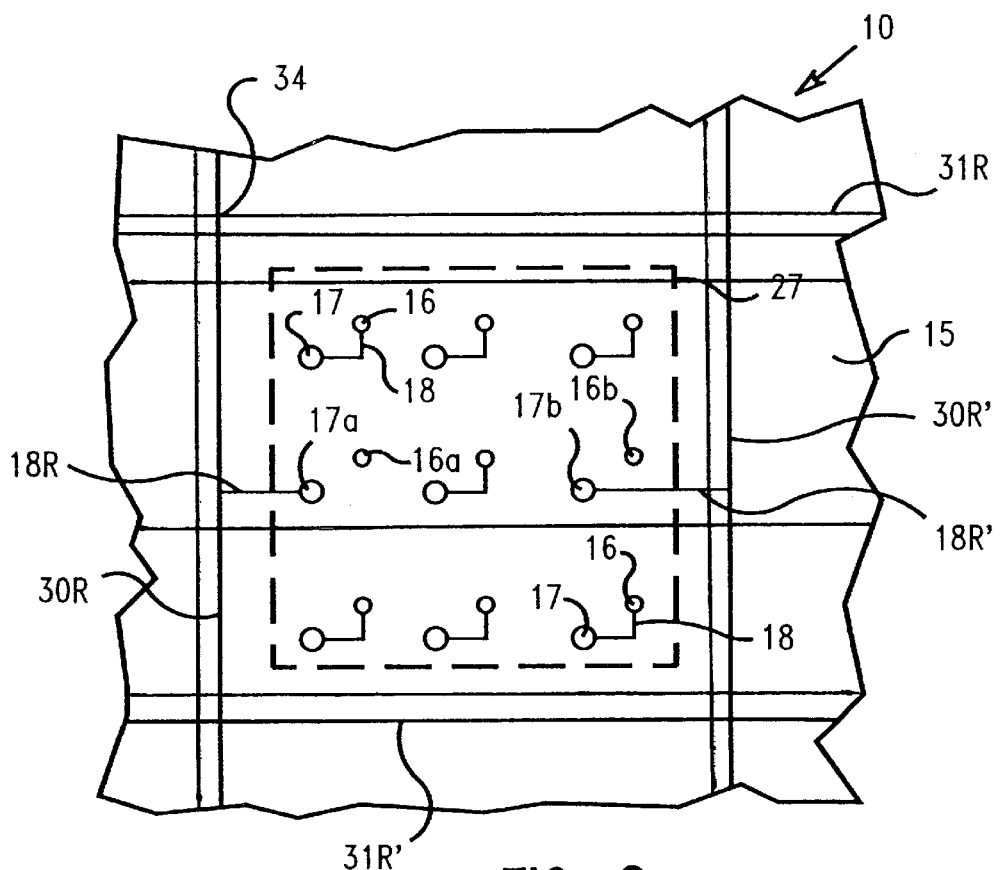
FIG. 2 is a partial top view of a MCM showing the top surface of a MLTF and the repair wiring using the repair method of the invention.

FIG. 2 shows a partial top view of a typical multilayer thin film structure showing one chip bounded by dotted lines 27 and a typical repair and EC scheme using the method of the invention. Defect-free vias 16 and their corresponding C4 pads 17 that support the C4 balls to connect to the chips are electrically connected by the via connection straps 18 which are shown L-shaped. The C4 pads 17 are shown preferably offset from the vias 16 to facilitate disconnecting a faulty thin film or ceramic net by either adding or deleting the straps so that no straps are connected to the repair lines. Via 16a was detected to be faulty by testing and preferably no strap fabricated for connection to its corresponding pad 17a. If strap 18a (not shown) connecting pad 17a and via 16a was fabricated strap 18a can be deleted by a laser delete technique to disconnect defective via 16a from pad 17a. Using, for example, the phototool procedure, repair strap 18R is formed and shown connected from C4 pad 17a to X repair line 30R and repair strap $18R^1$ is formed and shown connected from C4 pad 17b to X repair line $30R^1$ to repair the defective 16a and 16b via interconnections. A similar repair strap connection would be made from repair line 30R and $30R^1$ to the desired pads (not shown) either directly therefrom or in conjunction with one or more interconnected Y lines 31R and/or one or more X lines 30R.

In general the repair method comprises a series of steps as follows:

1. As shown in FIG. 1, build the layers of thin film 11, 12, 13 and 14 on capture level 19 which includes wiring patterns such as pads, straps, vias, etc. and preferably test for opens and shorts at each layer before the next layer is built. Typically each layer is made as follows. A dielectric material layer 11b such as polyimide or epoxy is applied and a via 11a defined for further interconnection. A seed plating layer is applied on top thereof and photoresist material then applied and exposed to define the wiring pattern. After developing, a metal such as copper is electroplated to form the wiring shown as 11c. The photoresist material and seed layer is then stripped. This is generally termed a lithography or photolithography process and may be used for additive or subtractive metallization procedures as is well-known in the art, e.g., as described in U.S. Pat. No. 5,258,236, which is incorporated herein by reference. This procedure is continued for each layer until the thin film structure is completed. Intralevel shorts/opens at each layer may be repaired using existing tools. Any plating method can be used, for example, either an additive or subtractive method as is known in the art.

2. After building the 5 layer structure, the Mesh 2 level 14 (FIG. 1) is tested to establish any interconnection defects, e.g., signal line/via opens/shorts. The nets that need to be repaired are determined and if the nets are thin film or ceramic (substrate) nets.

3. Build the top surface layer 15 as for the other layers preferably using a fixed mask and expose with C4 pads and via connecting straps at every via location and a series of X-Y conductor lines 30R, 30R', 31R and 31R' respectively as shown in FIG. 2. It would be preferred not to build the connector straps for defective via interconnections, however, this is not the most cost effective method and it is preferred to use a fixed mask and to build the straps and then to laser delete the straps associated with defective nets. Following the exposure of the fixed mask pattern containing all of the TSM features, the repair areas are then separately exposed, relying on the results of the electrical testing. This is done by defining the nets needing repair and selectively exposing the photoresist to define the conductor repair straps needed to contact the C4 pads of defective vias to X conductor lines 30R and/or Y conductor lines 31R to repair the MLTF component or make EC's. For example, as shown in FIG. 2, existing pads 17a and 17b of defective vias 16a and 16b respectively are connected by straps 18R and 18R' to X conductor lines 30R and 30R' to repair or make EC's for defective or unneeded vias 16a and 16b. Other X lines 30R and Y lines 31R are not shown for clarity. After completion of this second expose, the photoresist is then developed standard, producing a complete wiring image, and only requiring the defective strap laser disconnection operation to restore full functionality.

Figure 3:
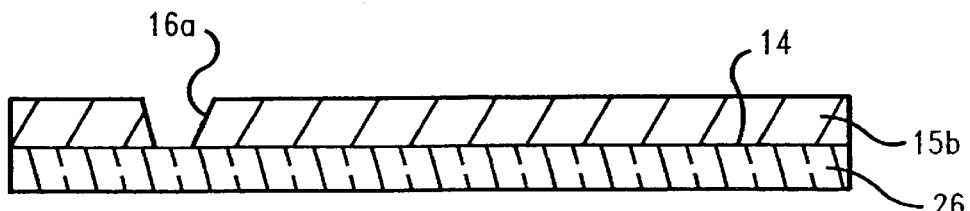
FIGS. 3–9 are side elevational views showing a sequence of steps which may be used to repair a multilayer thin film structure by the method of the invention.
Figure 4:
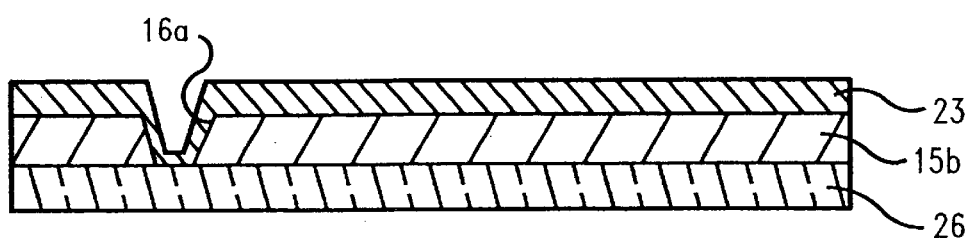
Figure 5:
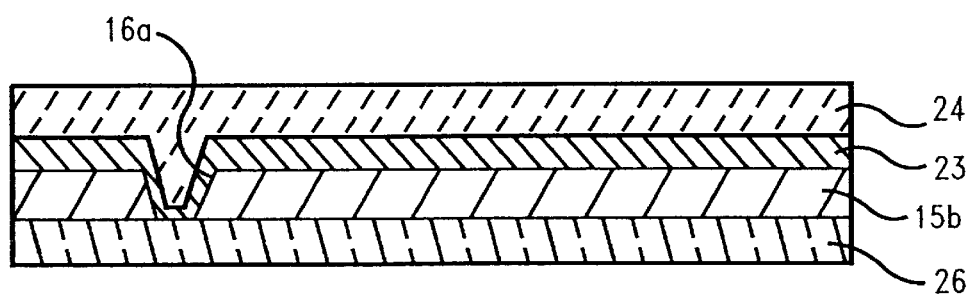
Figure 6:
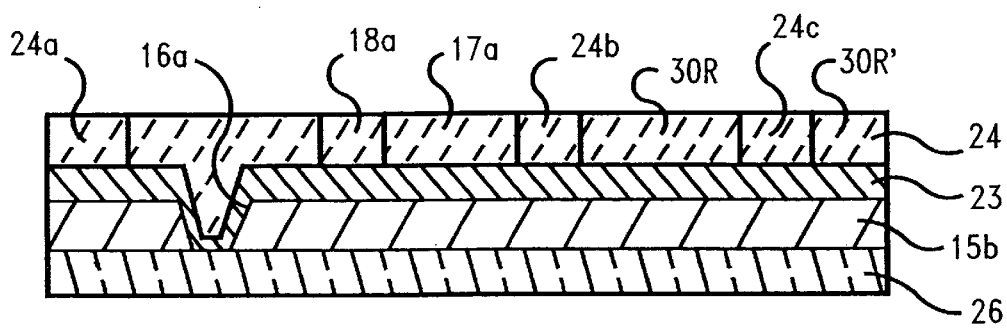
Figure 7:
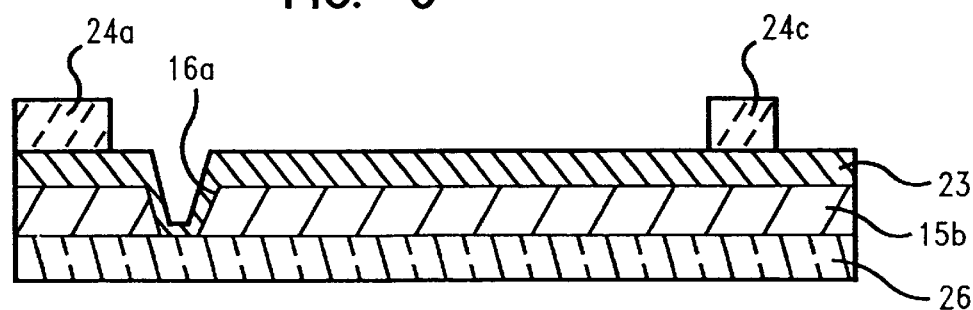
Figure 8:
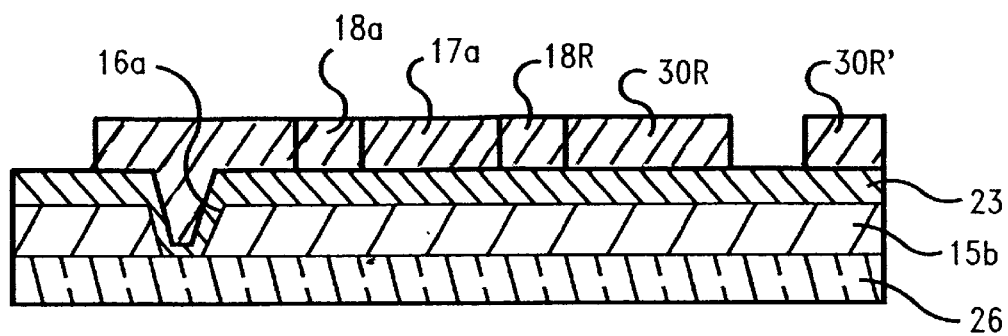
Figure 9:
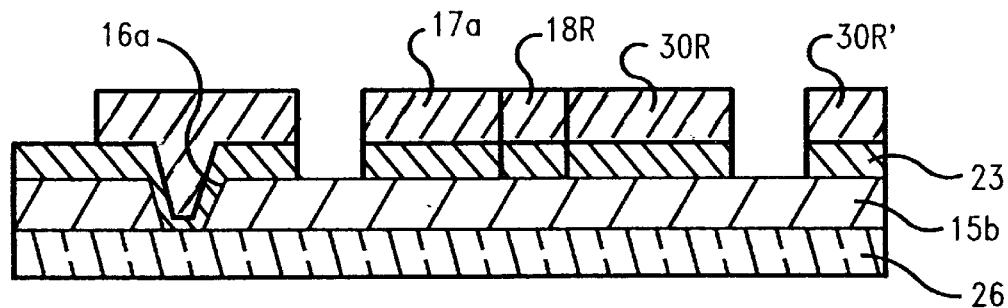
Figure 10:
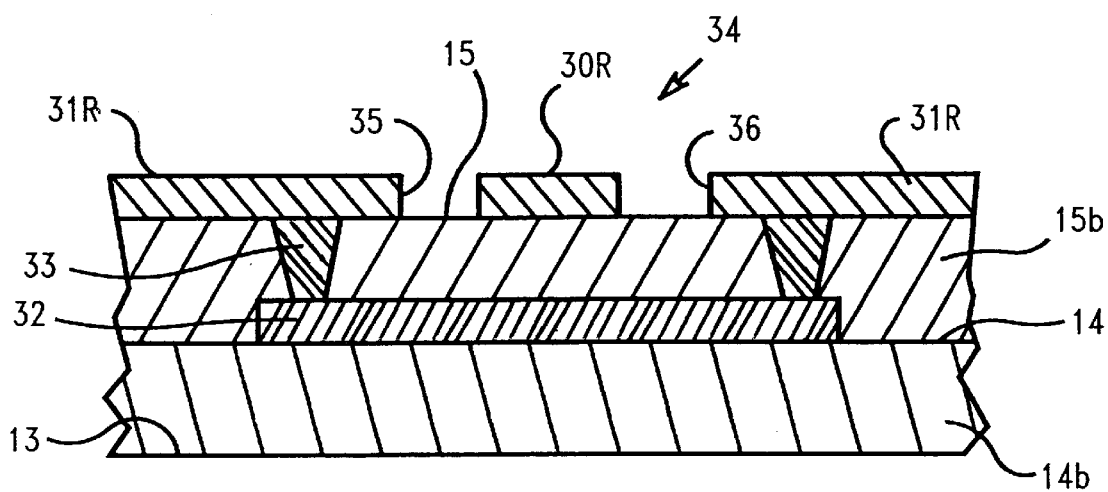
FIG. 10 is a partial side elevational view of a multilayer thin film structure electronic component showing the intersection of X and Y orthogonal conductive repair lines.

With regard to FIGS. 3–9, the repair method of the invention may be demonstrated for an additive metal plating process. In FIG. 3 the multilayer thin film substrate of FIG. 1 is shown schematically completed to the mesh 2 level 14 and is shown in composite as 26. Substrate 26 is then overcoated with a dielectric material such as polyimide layer 15b and via 16a defined by laser ablation or photolithography. Via 16a is shown as representing a wiring connection requiring repair. As shown in FIG. 10 below, vias are also formed to provide subway connections for orthogonal Y repair lines where the X and Y repair lines would cross (intersect). These subways and subway vias are not shown in FIGS. 3–9 for clarity. In FIG. 4, a thin metallic plating conductor layer 23 such as Cr/Cu at 2500 Å is applied to the dielectric layer 15b and via 16a. FIG. 5 shows the application of a thick positive photoresist material 24 to the metal layer 23. FIG. 6 shows exposing the photoresist layer 24 through a mask to expose and define orthogonal X repair lines 30R and 30R' and non-developable resist areas 24a, 24b and 24c. The orthogonal Y repair lines 31 are not shown in this figure for clarity. The fixed structures, i.e., chip connecting pads 17a, vias 16a and strap lines 18a are also exposed through a mask at the same time as areas 24 and repair lines 30R and 30R'. Referring to FIG. 6, using the data determined by testing the lower adjacent layer, it is determined that via 16a is defective and that a repair strap line is needed from pad 17a to X conductor line 30R. Area 24b is now exposed using a phototool transforming 24b from a section which will not be dissolved during developing to a section which will be dissolved. The photoresist 24 is a positive photoresist and as shown in FIG. 7 when it is developed it leaves only positive images 24a and 24c on the metal surface 23. Thus, 24a and 24c indicate areas on the top surface 15 of the electronic component that are not to be plated. The complete exposed image, consisting of the fixed mask pattern and the repair straps together is then developed.

FIG. 8 shows the substrate shown in FIG. 7 after metal plating (such as copper) followed by stripping of the photoresist areas 24a and 24c. As shown in FIG. 8, strap 18a, via 16a, conductor lines 30R and 30R', repair strap 24b (now shown as repair strap 18R) and pad 17a are formed on the top surface of the structure. Original strap 18a is laser deleted as shown in FIG. 9 and the plating conductor layer 23 has been etched from the unprotected areas leaving a conductor layer 23 under each of the repair lines 30R and 30R', repair strap 18R and pad 17a. Defective via 16a is now isolated and pad 17a is connected to X repair line 30R by repair strap 18R. Conductor line 30R will typically be connected to other X and/or Y repair lines and terminate at a desired pad location on the module by a repair strap from the repair line to the pad formed using a phototool as described above.

FIG. 10 shows the MLTF circuitry used where the X and Y orthogonal conductor repair lines cross on the top surface layer. The X and Y lines can not, of course, contact each other except when necessary to connect an X line and Y line to define the repair path. Thus, intersection 34 shown in FIG. 2 is shown in FIG. 10 and comprises Y wiring level 13 and mask 2 layer 14. A subway 32 is formed on layer 14 by techniques described above to form metallization such as vias, pads, etc. Vias 33 are also formed to connect with layer surface 15. When the top surface metallurgy is formed on surface 15, Y line 31R and X line 30R are plated as shown.

To avoid Y line 31R from contacting X line 30R where the lines would cross, Y line 31R is interrupted at points 35 and 36 and connected to subway 32 by vias 33. Thus, Y line 31R is electrically continuous without contacting orthogonal continuous X line 30R.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A multilayer thin film structure which comprises a series of layers comprising a dielectric having metal thereon in the form of wiring and via interconnections and a top surface layer of the structure consisting essentially of vias, chip connection pads, via-pad connection straps and a plurality of orthogonal X conductor lines and Y conductor lines and defined metal strap repair lines thereon which repair lines are defined only for defective or unwanted via interconnections by testing for interconnection defects at the lower layer adjacent the surface layer, said defined metal strap repair lines connecting the chip connection pads of defective or unwanted via interconnections to the X conductor lines and/or Y conductor lines with the other end of the X conductor lines and/or Y conductor lines being connected by the defined metal strap repair lines to other pads and/or vias to form a circuit and repairing defective interconnections and/or make engineering changes.

2. The structure of claim 1 wherein the strap repair lines are formed by lithography.

3. The structure of claim 2 wherein additive or subtractive metallization is used to form the repair lines.

4. The structure of claim 3 wherein the lithography process is performed by exposing a photoresist material on the top surface layer to form the desired metal strap repair line pattern.

5. The structure of claim 1 wherein a plurality of multilayer thin film structures are used to make a multi-chip module electronic package and the X and/or Y conductor metal lines connect the chip connection pads of defective or unwanted via interconnections in one or more chip sites of the package.

* * * * *